United States Patent
Kubota et al.

(10) Patent No.: US 7,901,846 B2
(45) Date of Patent: Mar. 8, 2011

(54) PELLICLE AND METHOD FOR MANUFACTURING THE SAME

(75) Inventors: Yoshihiro Kubota, Gunma (JP); Shoji Akiyama, Gunma (JP); Toshihiko Shindoo, Gunma (JP)

(73) Assignee: Shin-Etsu Chemical Co., Ltd., Tokyo (JP)

(*) Notice: Subject to any disclaimer, the term of this patent is extended or adjusted under 35 U.S.C. 154(b) by 188 days.

(21) Appl. No.: 12/251,582

(22) Filed: Oct. 15, 2008

(65) Prior Publication Data

US 2009/0104544 A1  Apr. 23, 2009

(30) Foreign Application Priority Data

Oct. 18, 2007 (JP) ............................. 2007-270843
Nov. 12, 2007 (JP) ............................. 2007-293692

(51) Int. Cl.
*G03F 1/00* (2006.01)
*A47G 1/12* (2006.01)

(52) U.S. Cl. ............................................. 430/5; 428/14

(58) Field of Classification Search ............. 430/5; 428/14; 355/53, 75; 250/492.2
See application file for complete search history.

(56) References Cited

U.S. PATENT DOCUMENTS

| | | | |
|---|---|---|---|
| 5,935,733 A * | 8/1999 | Scott et al. ..................... | 430/5 |
| 6,197,454 B1 | 3/2001 | Yan | |
| 6,623,893 B1 * | 9/2003 | Levinson et al. ............... | 430/5 |
| 2003/0228529 A1 * | 12/2003 | Dieu et al. ..................... | 430/5 |
| 2005/0048380 A1 * | 3/2005 | Nagata .......................... | 430/5 |
| 2009/0274962 A1 * | 11/2009 | Kubota et al. .................. | 430/5 |
| 2009/0291372 A1 * | 11/2009 | Kubota et al. .................. | 430/5 |

FOREIGN PATENT DOCUMENTS

WO    WO 2008/060465 A1    5/2008

OTHER PUBLICATIONS

Banqiu Wu, et al., "Extreme Ultraviolet Lithography: A Review", J. Vac. Sci. Technol., B 25(6), Nov./Dec. 2007, 1743-1761.
U.S. Appl. No. 12/434,021, filed May 1, 2009, Kubota, et al.
U.S. Appl. No. 12/446,042, filed May 14, 2009, Kubota, et al.

(Continued)

*Primary Examiner* — Stephen Rosasco
*Assistant Examiner* — Stewart A Fraser
(74) *Attorney, Agent, or Firm* — Oblon, Spivak, McClelland, Maier & Neustadt, L.L.P.

(57) ABSTRACT

A pellicle of the present invention is provided with a silicon crystal film, the absorption coefficient of which is 0.005/nm or lower with respect to light having a wavelength of 13.5 nm, as a pellicle film. The silicon crystal film is an indirect transition type semiconductor film and, therefore, the optical absorption coefficient thereof is relatively low. In particular, a single-crystal silicon film has a lower absorption coefficient than an amorphous silicon film and a polysilicon film. Thus, it is easy to obtain desired transmissivity required of a pellicle film for EUV from the single-crystal silicon film. Such a pellicle film as described above can be fabricated from an SOI film obtained by thin-filming an SOI substrate (including an SOQ substrate and an SOG substrate).

13 Claims, 2 Drawing Sheets

OTHER PUBLICATIONS

Yashesh A. Shroff, et al., "EUV Pellicle Development for Mask Defect Control", Emerging Lithographic Technologies X, Proc. of SPIE vol. 6151, (2006), pp. 615104-1-615104-10.

Edvard D. Palik, ed., "Handbook of Optical Constants of Solids", Academic Press, INC., Orlando, (1985), 24 pages.

Isao Yamada, "Cluster Ion Beam—Basic and Applications", Chapter 4 Nikkan Kogyo, Ltd., pp. 127-206, (with English translation, 3 pages).

* cited by examiner

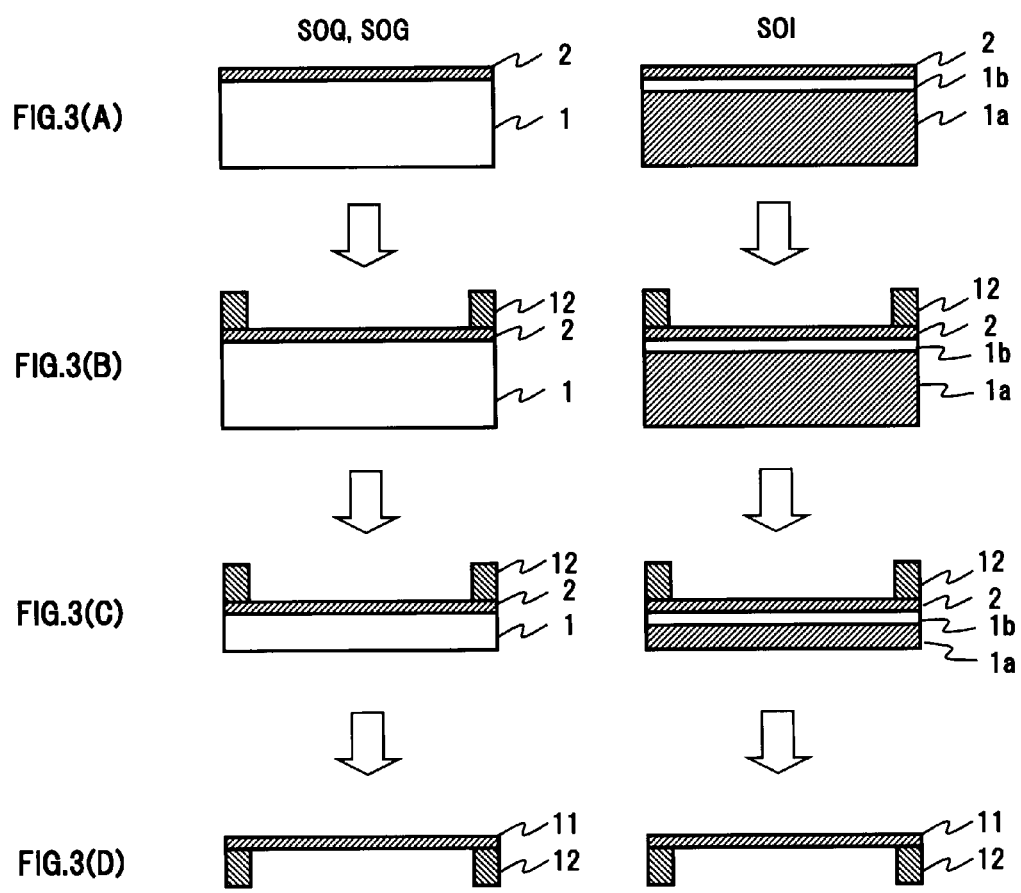

PELLICLE AND METHOD FOR MANUFACTURING THE SAME

BACKGROUND OF THE INVENTION

1. Field of the Invention

The present invention relates to a pellicle for lithography and, more particularly, to a pellicle suitable for lithography using extreme ultraviolet light (EUV: Extreme Ultra-Violet) and a method for manufacturing the pellicle.

2. Description of the Related Art

Along with the increasingly higher integration of a semiconductor device, a pattern to be formed by lithography has been miniaturized. Nowadays, even a device having a pattern width of 45 nm or so is being put into practical use. Such a thin-line pattern can be realized by lithography using an ArF immersion method, a double exposure method or the like which are improved versions of a conventional excimer exposure technique.

With lithography based on such excimer exposure techniques as described above, however, it is considered difficult to cope with patterning requiring further miniaturization in which a pattern width is 32 nm or less. Hence, lithography using extreme ultraviolet light (EUV: Extreme Ultra-Violet) is now a focus of attention as a new exposure technique alternative to the above-described techniques.

For the practical application of an exposure technique using EUV light having a dominant wavelength of 13.5 nm, it is essential to develop a new resist, pellicle and the like, not to mention a light source. Among these, a significant progress has been seen in the development of the light source and resist. On the other hand, many technical problems that must be solved in order to realize a pellicle for EUV remain unsolved in the development of the pellicle.

A pellicle film to be provided in the pellicle for EUV is required to have high degrees of transmittance and chemical stability with respect to EUV light, needles to say a dust-preventing function for preventing foreign matter from adhering onto a photomask. The present situation is, however, that no solutions have yet been in sight to the problem of developing practical pellicle film materials superior in transmittance and chemical stability.

At present, there is not known any material transparent to light in a wavelength band having a dominant wavelength of 13.5 nm. On the other hand, silicon has a relatively high degree of transmissivity to light in this wavelength band and, therefore, has come to attract attention as a pellicle film material for EUV (see, for example, Shroff et al. "EUV pellicle development for mask defect control", Emerging Lithographic Technologies X, Proc of SPIE Vol. 6151 615104-1 (2006): (non-patent document 1), U.S. Pat. No. 6,623,893 Specification: (patent document 1)).

However, the silicon used as a pellicle film in non-patent document 1 is a film deposited by means of sputtering or the like and is, therefore, inevitably amorphous. Consequently, the absorption coefficient of the film in an EUV region becomes high and, therefore, the transmissivity thereof becomes unavoidably low.

The material of the pellicle film disclosed in patent document 1 is also silicon and this silicon film is presupposed to be deposited by means of CVD or the like. Since the silicon film in this case inevitably results in an amorphous or polycrystalline film, the absorption coefficient thereof in the EUV region becomes unavoidably high.

In addition, a strong stress tends to be introduced into a film of silicon crystal, like the pellicle film disclosed in patent document 1 or non-patent document 1, formed using a sputtering method or a CVD method. This leads to another problem that the optical characteristics of the film tend to degrade or become nonuniform due to the stress.

SUMMARY OF THE INVENTION

The present invention has been accomplished in view of the above-described problems. It is therefore an object of the present invention to provide a pellicle provided with a practical pellicle film for EUV superior in transmittance and chemical stability.

In order to solve the above-described problems, a pellicle of the present invention is provided with a silicon crystal film, the absorption coefficient of which is 0.005/nm or lower with respect to light having a wavelength of 13.5 nm, as a pellicle film.

Preferably, the silicon crystal film is a single-crystal silicon film, which is obtained by thin-filming an SOI substrate. Note that the crystal plane orientation of the single-crystal silicon film is preferably a (100) plane.

The pellicle of the present invention may be provided with a protective film on at least one principal surface of the silicon crystal film. In this case, the absorption coefficient of the protective film with respect to light having a wavelength of 13.5 nm is preferably 0.05/nm or lower.

This protective film is made of at least one material selected from the group consisting, for example, of SiC, $SiO_2$, $Si_3N_4$, SiON, $Y_2O_3$, YN, Mo, Ru and Rh.

A manufacturing method for realizing such a pellicle as described above comprises the steps of connecting a pellicle film holding means to one principal surface of a substrate where a silicon crystal film is formed, and forming said silicon crystal film into a pellicle film by removing a supporting substrate from the other principal surface side of said substrate, wherein the absorption coefficient of said silicon crystal film with respect to light having a wavelength of 13.5 nm is 0.005/nm or lower.

This manufacturing method may further include a step of forming a protective film on at least one surface of the silicon crystal film.

In this case, the forming of the protective film is carried out by coating a film made of at least one material selected from the group consisting, for example, of SiC, $SiO_2$, $Si_3N_4$, SiON, $Y_2O_3$, YN, Mo, Ru and Rh.

A gas cluster ion beam deposition method is preferred as a method for coating the protective film.

In the present invention, a silicon crystal film, the absorption coefficient of which is 0.005/nm or lower with respect to light having a wavelength of 13.5 nm, is used as a pellicle film. Consequently, it is possible to provide a pellicle provided with a practical pellicle film for EUV superior in transmittance and chemical stability.

BRIEF DESCRIPTION OF THE DRAWINGS

FIGS. 3(A) to 3(D) are schematic views used to explain process examples of a method for manufacturing a pellicle of the present invention.

DESCRIPTION OF THE PREFERRED EMBODIMENTS

Hereinafter, a structure of a pellicle of the present invention will be described with reference to the accompanying drawings.

Figure 1A:
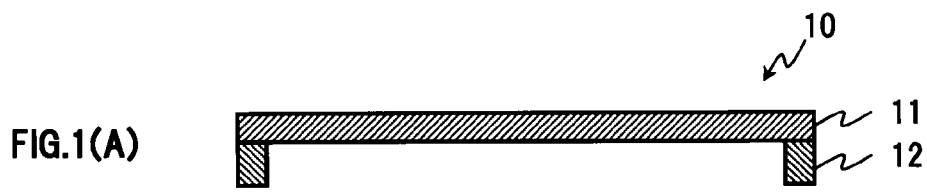
FIGS. 1(A) and 1(B) are schematic cross-sectional views used to explain structural examples of a pellicle of the present invention.
Figure 1B:
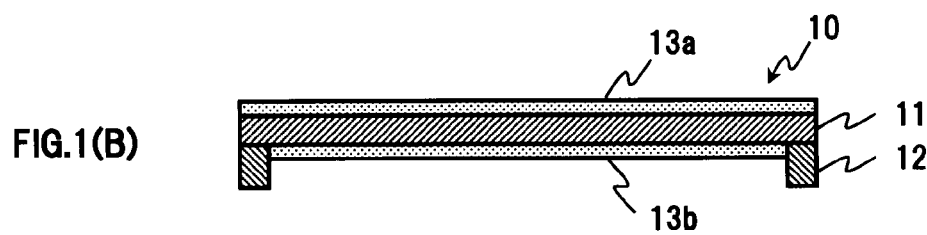

FIGS. 1(A) and 1(B) are schematic cross-sectional views used to explain structural examples of a pellicle of the present invention. A pellicle 10 is provided with a silicon crystal film, the absorption coefficient of which is 0.005/nm or lower with respect to light having a wavelength of 13.5 nm, as a pellicle film 11. The pellicle film 11 is bonded to an edge face of a pellicle frame 12.

The silicon crystal film provided as the pellicle film 11 is an indirect transition type semiconductor film and, therefore, the optical absorption coefficient thereof is relatively low. The silicon crystal film may alternatively be an amorphous silicon film or a polysilicon film as long as the film has the above-described absorption coefficient, but is preferably a single-crystal silicon film. The reason for this is that the absorption coefficient of an amorphous silicon film or a polysilicon film with respect to EUV light tends to be high, depending on the method of growth thereof and the like. Thus, it is likely that there arises the need to form the silicon film into an ultrathin film in order to obtain desired transmissivity required of a pellicle film for EUV.

Since the absorption coefficient of amorphous silicon with respect to visible light is about one order of magnitude higher than that of single-crystal silicon, amorphous silicon is widely used as a material for thin-film solar cells. The absorption coefficient of amorphous silicon is relatively high also with respect to light in an EUV region.

Figure 2:
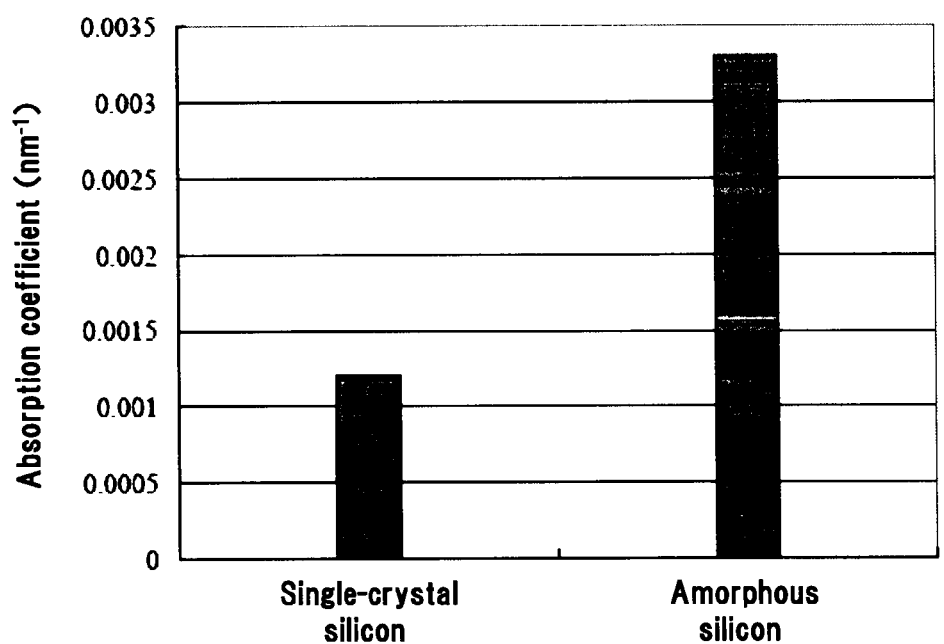
FIG. 2 shows an example of comparison between the absorption coefficients of single-crystal silicon and amorphous silicon with respect to light having a wavelength near 13.5 nm.

FIG. 2 shows an example of comparison between the absorption coefficients of single-crystal silicon and amorphous silicon with respect to light having a wavelength near 13.5 nm (non-patent document 2: Edward D. Palik, ed., "Handbook of Optical Constants of Solids," Academic Press, Orlando (1985)). It is expected that the optical characteristics of amorphous silicon can vary depending also on the method of growth thereof. As illustrated by way of example in this figure, however, single-crystal silicon has a lower absorption coefficient than amorphous silicon also in the EUV region. Single-crystal silicon is, therefore, a preferred material for use as a pellicle film for EUV.

The purpose of imposing restrictions on the absorption coefficient of a silicon crystal film used as a pellicle film is to ensure that the transmissivity of EUV light is 50% or higher even for an approximately 150 nm-thick pellicle film. Assuming that the absorption coefficient of the pellicle film is $\alpha$ ($nm^{-1}$) and the thickness thereof is x (nm), then the intensity I of light transmitting through the pellicle film is given by equation (1) shown below, where the intensity of incident light is $I_0$:

$$I = I_0 e^{-\alpha x} \quad (1)$$

Consequently, the thickness x of the pellicle film required for the transmissivity of EUV light to be 50% or higher is approximately $0.693/\alpha$. Thus, it is possible even for a 140 nm-thick pellicle film to secure an EUV transmissivity of 50% as long as the absorption coefficient $\alpha$ thereof is 0.005/nm or lower.

Such a pellicle film as described above can be fabricated from an SOI film obtained by thin-filming an SOI substrate (the term "SOI substrate" is used as inclusive of an SOQ substrate and an SOG substrate in a broad sense) using, for example, a later-described method. In this case, the pellicle film has the advantage of being superior in workability if the crystal plane orientation of the single-crystal silicon film thereof is a (100) plane.

The pellicle 10 of the present invention may be such that a protective film (13a, 13b) is provided on at least one principal surface of a silicon crystal film which is the pellicle film 11, in order to cover a silicon crystal surface (FIG. 1(B)). Such a protective film as described above has the role of, for example, preventing the surfaces of the silicon crystal film from being oxidized by light from a high-output light source. For example, a ceramic film of SiC, $SiO_2$, $Si_3N_4$, SiON, $Y_2O_3$, YN or the like or a metal film of Mo, Ru, Rh or the like can be mentioned as an example of the protective film. It is also possible to form the protective film from a film made of a material available from a combination of these films or provide the protective film in a form in which a plurality of films is laminated.

There are no particular restrictions on a method for forming the protective film, and the protective film can be formed using a heretofore known CVD method, sputtering method, electron beam deposition method, or the like. With a gas cluster ion beam (GCIB) deposition method, however, it is possible to form a high-density, compact protective film whose density is close to a theoretical density. Thus, it is possible to expect high oxidation resistance from the protective film even if the film is thin (non-patent document 3: Isao Yamada, "Cluster Ion Beam—Basics and Applications" Chapter 4 Nikkan Kogyo, Ltd.). Consequently, a GCIB deposition method is preferred as a method for forming a protective film without significantly degrading transmissivity required of a pellicle.

Since it is easy to form a protective film relatively thinly, the absorption coefficient thereof need not be as low as that of a pellicle film. It is preferable, however, that the absorption coefficient is 0.05/nm or lower with respect to light having a wavelength of 13.5 nm. In a case where a protective film is provided, the thicknesses and the like of the protective film and a pellicle film are designed so that the transmissivity of EUV light transmitting through the protective film and the pellicle film is 50% or higher.

Silicon crystal can also be selected as a material for the pellicle frame 12. Silicon crystal (single crystal, in particular) has the advantage of being highly pure and able to ensure required mechanical strength, as well as the advantage of being able to prevent dust generation when used as a pellicle frame.

Note that if transmissive films (pellicle film and protective film) become contaminated or cracked, the films need to be replaced. It is therefore preferable that the transmissive films can be easily detached and attached. Accordingly, it is preferable that the bonding of the pellicle frame and the pellicle film is based on a mechanical fixation method using an adhesive agent, a magnet, an electrostatic chuck, or a hook whereby the films can be detached and attached, rather than on a fixation method using a usual bonding agent or solder. Such mechanical fixation members are preferably resistant to deterioration by the radiation of EUV light or are preferably provided so as to be shielded from EUV light.

The work of bonding a pellicle to a photomask is generally carried out under normal pressure, whereas EUV exposure is performed under vacuum. Accordingly, the pellicle frame is desirably provided with a pressure-regulating mechanism. Such a pressure-regulating mechanism needs to have a structure in which no foreign matter mixes with a gas when the gas flows in or out. Hence, the pressure-regulating mechanism is preferably provided with a filter, such as a ULPA filter, capable of trapping even extremely microscopic foreign matter. It is important that such a filter as described above has an area whereby a transmissive film does not significantly expand or contract, or become broken, due to a nonuniform difference in pressure.

Embodiment 1

FIGS. 3(A) to 3(D) are schematic views used to explain process examples of a method for manufacturing a pellicle of the present invention. The supporting substrate 1 of an SOI (Silicon On Insulator) substrate illustrated in FIG. 3(A) is a substrate in which an oxide film 1b is provided on a surface of a silicon substrate 1a. The supporting substrates 1 of an SOQ (Silicon On Quartz) substrate and an SOG (Silicon On Glass) substrate are a quartz substrate and a glass substrate, respectively. On a principal surface of each of these supporting substrates 1, there is provided a single-crystal silicon crystal film 2 and this silicon crystal film 2 becomes a pellicle film.

The silicon substrate 1a serving as the supporting substrate of the SOI substrate is a commercially-available single-crystal silicon substrate grown using, for example, a Czochralski (CZ) method. The oxide film 1b is previously formed on a surface of this single-crystal silicon substrate 1a by means of thermal oxidation or the like to a thickness of approximately 100 nm. On top of the oxide film 1b, there is formed the single-crystal silicon crystal film 2 serving as an SOI layer.

Every silicon crystal film 2 provided on these supporting substrates is a silicon single-crystal (Nearly Perfect Crystal: NPC) thin film having less crystal defects, such as COP. The silicon crystal film 2 is an approximately 70 nm-thick film having an absorption coefficient of approximately 0.0015 $nm^{-1}$ with respect to EUV light.

These SOI substrate, SOQ substrate and SOG substrate are rectangular substrates having a 122 mm-long short side and a 149 mm-long long side. A pellicle frame 12 made of silicon crystal is bonded to the silicon crystal film 2 which is the front surface side of each of these rectangular substrates (FIG. 3(B)). Then, polishing and etching are applied from the rear surface side of the supporting substrate 1 (FIG. 3(C)) to obtain the silicon crystal film 2 held by the pellicle frame 12 (FIG. 3(D)). Note that this pellicle frame 12 is 7 mm in height and 2 mm in thickness, where a plurality of openings for mounting a ULPA filter is provided on side surfaces of the pellicle frame 12 and a 1 mm-wide, 2 mm-deep trench is formed in the outermost circumference on the rear surface of the pellicle frame 12.

In the case of the SOI substrate, the silicon substrate 1a, which is a supporting substrate, is first thinned down to approximately 100 μm, and then the rest of a silicon portion is etched away using a KOH etchant to expose the oxide film 1b. After that, the oxide film 1b is removed using HF, to leave over only the silicon crystal film 2.

In the case of the SOQ substrate and the SOG substrate, it is possible to leave over only the silicon crystal film 2 by removing the rest of an $SiO_2$ portion using HF, after polishing the supporting substrate 1 from the rear surface thereof to thin down the substrate to a thickness of approximately 100 μm.

Finally, a ULPA filter is mounted on the pellicle frame 12 in a state of being integral with the silicon crystal film 2. In addition, a silicone adhesive agent for exposure light shielding is injected into the trench provided in the outermost circumference on the rear surface of this pellicle frame 12, thereby obtaining a pellicle 10.

If a pellicle film made of a silicon crystal film is formed using an SOI substrate, SOQ substrate or SOG substrate as in the present invention, no extreme stress is applied in the course of removing the supporting substrate to form the pellicle film made solely of the silicon crystal film. In addition, no strain is introduced since the formation of the pellicle film is completed under approximately room temperature.

Note that such a protective film as illustrated in FIG. 1(B) may be formed on the front and rear surfaces of the silicon crystal film 11 supported by the obtained pellicle frame 12 as illustrated in FIG. 3(D). Alternatively, the protective film may be previously formed on the silicon crystal film 2 prior to thin-filming the supporting substrate.

Embodiment 2

A silicon crystal film 11 supported by a pellicle frame 12 is obtained according to steps explained using FIGS. 3(A) to 3(D). Note that the thickness of the silicon crystal film 11 of the present embodiment is 20 nm. In addition, a several nanometers thick SiC thin film is deposited respectively on the front and rear surfaces of this silicon crystal film 11 using a gas cluster ion beam deposition method, in order to coat the silicon crystal film.

It has been confirmed that both of the pellicles obtained in embodiments 1 and 2 have a transmissivity of 50% or higher with respect to EUV light, show a practical-use level of throughput at the time of EUV exposure, and are completely free from degradation in the yield of devices due to foreign matter.

As described heretofore, the present invention provides a pellicle provided with a practical pellicle film for EUV superior in transmittance and chemical stability.

What is claimed is:

1. A method for manufacturing a pellicle, comprising:
   forming a single crystal silicon film on a principal surface of a substrate, where said single crystal silicon film has an exposed surface opposite to a surface of said single crystal silicon film present on said principle surface;
   bonding a support frame, comprised of single crystal silicon, to said exposed surface of said single crystal silicon film; and
   completely removing said substrate by polishing and etching said substrate, thereby exposing a surface of said single crystal silicon film present on said substrate,
   wherein the absorption coefficient of said silicon crystal film with respect to light having a wavelength of 13.5 nm is 0.005/nm or lower.

2. A method according to claim 1, which results in a pellicle, comprising:
   a support frame; and
   a single crystal silicon film, as the pellicle film, bonded to said support frame, wherein a material of said a support frame comprises single crystal silicon.

3. A method according to claim 2, wherein a material of said support frame is single crystal silicon.

4. A method according to claim 2, wherein
   a protective film is present on at least one principle surface of said single crystal silicon film; and
   a material of said protective film is at least one material selected from the group consisting of SiC, $SiO_2$, $Si_3N_4$, SiON, $Y_2O_3$, YN, Mo, Ru, and Rh.

5. A method according to claim 1, further comprising depositing a protective film on at least one principle surface of said single crystal silicon film, wherein a material of said protective film is at least one material selected from the group consisting of SiC, $SiO_2$, $Si_3N_4$, SiON, $Y_2O_3$, YN, Mo, Ru, and Rh.

6. A method according to claim 5, wherein said depositing is carried out by gas cluster ion beam depositing.

7. A method according to claim 1, further comprising depositing a protective film on at least two principle surfaces of said single crystal silicon film, wherein a material of said protective film is at least one material selected from the group consisting of SiC, $SiO_2$, $Si_3N_4$, SiON, $Y_2O_3$, YN, Mo, Ru, and Rh.

8. A method according to claim 7, wherein said depositing is carried out by gas cluster ion beam depositing.

9. A method according to claim 1, wherein said substrate is Silicon on Insulator, SOI, Silicon on Quartz, SOQ, or Silicon on Glass, SOG.

10. A method according to claim 1, wherein said substrate is Silicon on Insulator, SOI.

11. A method according to claim 1, wherein said substrate is Silicon on Quartz, SOQ.

12. A method according to claim 1, wherein said substrate is Silicon on Glass, SOG.

13. A method according to claim 1, wherein a crystal plane orientation of said single crystal silicon film is a (100) plane.

* * * * *